United States Patent
Lee et al.

(10) Patent No.: US 6,815,833 B2
(45) Date of Patent: Nov. 9, 2004

(54) FLIP CHIP PACKAGE

(75) Inventors: Shih-Chang Lee, Kaohsiung (TW); Gwo-Liang Weng, Kaohsiung (TW); Wei-Chang Tai, Kaohsiung (TW); Cheng-Yin Lee, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/657,230

(22) Filed: Sep. 9, 2003

(65) Prior Publication Data
US 2004/0089879 A1 May 13, 2004

(30) Foreign Application Priority Data
Nov. 13, 2002 (TW) ........................................ 91133275 A

(51) Int. Cl.⁷ ............................................. H01L 23/48
(52) U.S. Cl. ...................... 257/778; 257/666; 257/737; 257/738; 257/786
(58) Field of Search ............................ 257/81, 99, 459, 257/625, 666–677, 737, 738, 778–786, 796, 584, 177–181, 688, 689, 705–707, 712–722; 438/108, 118, 123, 124, 612–614, 617, 666

(56) References Cited
U.S. PATENT DOCUMENTS

| | | | | | |
|---|---|---|---|---|---|
| 5,091,341 A | * | 2/1992 | Asada et al. | ................... | 29/827 |
| 5,217,922 A | * | 6/1993 | Akasaki et al. | ............. | 438/125 |
| 5,378,924 A | * | 1/1995 | Liang | ........................ | 257/675 |
| 5,753,969 A | * | 5/1998 | Suzuya et al. | .............. | 257/667 |
| 6,282,094 B1 | * | 8/2001 | Lo et al. | ..................... | 361/704 |
| 6,314,639 B1 | * | 11/2001 | Corisis | ........................ | 29/827 |
| 6,331,451 B1 | * | 12/2001 | Fusaro et al. | ............... | 438/126 |
| 6,355,502 B1 | * | 3/2002 | Kang et al. | ................. | 438/110 |
| 6,583,513 B1 | * | 6/2003 | Utagikar et al. | ............ | 257/778 |

* cited by examiner

Primary Examiner—David Nelms
Assistant Examiner—Andy Huynh
(74) Attorney, Agent, or Firm—Bacon & Thomas

(57) ABSTRACT

A flip chip package mainly comprises a chip, a leadless lead frame. The leadless lead frame has a die paddle and a plurality of leads. The active surface of the chip has a plurality of bonding pads formed thereon. Besides, a plurality of bumps formed on the bonding pads are electrically connected to the chip, the leads and the die paddle. Therein, the die paddle electrically connected to the chip via the bumps not only prevents the chip from being dislocated but also provides another grounding and heat transmission paths to enhance the electrical, thermal and mechanical performance of the flip chip package. Similarly, the bumps formed on the bonding pads of the chip are electrically connected to the leads so as to fix the chip to the lead frame more securely.

50 Claims, 5 Drawing Sheets

FLIP CHIP PACKAGE

BACKGROUND OF THE INVENTION

1. Field of Invention

This invention relates to a flip chip package. More particularly, the present invention is related to a flip chip package with a leadless lead frame.

2. Related Art

Integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits. Nowadays, ball grid array package (BGA) and chip scale package (CSP) are wildly applied to chip package with high I/Os and assembly package for thermal enhance integrated circuits.

However, assembly package with lead frame possesses great marketing for that it can provide low-cost solutions for current semiconductor package. Due to lead frame with long inner leads and outer leads, such conventional lead frame assembly package can not applied to chip scale package and low profile package. Thus leadless assembly package is wildly provided in the semiconductor package industry to reduce the size of the assembly package in the recent years. Referring to FIGS. 1 and 2, a conventional leadless assembly package is disclosed. The leadless assembly package 100 mainly comprises a leadless lead-frame 110, a chip 120, an encapsulation 130 and a plurality of conductive wires 140. The lead frame 110 has a plurality of leads 110a, a die paddle 110b and four tie bars 110c. Each tie bar 110c is connected to the die paddle 110b as shown in FIG. 2. In addition, the die 120 is disposed on the die paddle 110b of the leadless lead frame 110 by an adhesive layer 150, and is electrically connected to the leads 110a of the leadless lead frame 110 through the conductive wires 140. And the encapsulation 130 encapsulates the leadless lead frame 110, the die 120 and the conductive wires 140.

The die paddle 110b of the leadless assembly package 100 exposes to the bottom of the leadless assembly package 100 so as to improve the thermal performance of the leadless assembly package. Moreover, due to the short leads, the impedance will be lower. Accordingly, the leadless assembly package is especially adapted to the assembly package with high-frequency devices, which are performed at the frequency from 10 GHz to 100 GHz, enclosed therein. In such a manner, such leadless assembly package has low cost and competitive price. Therefore the leadless assembly package is adapted to cell phone, personal digital application (PDA), digital camera and information application (IA).

The wire-bonding method is utilized to manufacture conventional leadless assembly packages, so the signal is transmitted through the wires. Therefore the impedance will become higher when the high frequency signal is transmitted in the assembly package. Accordingly, a flip chip package is disclosed to reduce the impedance by using bumps for transmitting signal. However, when the bumps are attached to the die paddle of the lead frame, the die is dislocated so as to cause the bumps not to connect the leads well. Moreover, the die is tilted to cause the die to be damaged.

Consequently, providing another leadless package to solve the mentioned-above disadvantages and disposing the die on the lead frame precisely is the most important task in this invention.

SUMMARY OF THE INVENTION

In view of the above-mentioned problems, an objective of this invention is to provide a flip chip package adapted to a leadless assembly package, which can make the die disposed on the lead frame precisely.

To achieve the above-mentioned objective, a flip chip package adapted to leadless assembly package is provided, wherein the flip chip package at least comprises a chip and a lead frame. The lead frame has a die paddle and a plurality of leads, and the chip has a plurality of bonding pads formed on the active surface of the chip. In addition, a plurality of bumps formed on the bonding pads not only electrically connect the chip and the die paddle but also electrically connect the chip and the leads. Therein the bumps electrically connected to the die paddle not only prevents the die from being dislocated but also is regarded as paths for grounding and transmitting heat.

Besides, at least one of the plural leads has a first concavity and the die paddle has at least one second concavity corresponding to one of the bonding pads. Accordingly, when the chip is flipped and mounted to the lead frame, the bumps can be disposed in the first concavities and the second concavities securely. Consequently, the die can be attached to the lead frame securely and prevent the die from being dislocated. Moreover, the die will not be tilted and cause the die to be connected to the lead frame well. In addition, a plurality of another concavities can be formed at the tie bars to further fix the die to the lead frame.

Accordingly, the bumps connecting the chip and the die paddle or connecting the chip and the tie bars can be another heat dissipation paths and grounding paths.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The flip chip package especially adapted to the leadless assembly package according to the preferred embodiment of this invention will be described herein below with reference to the accompanying drawings, wherein the same reference numbers refer to the same elements.

Figure 1:
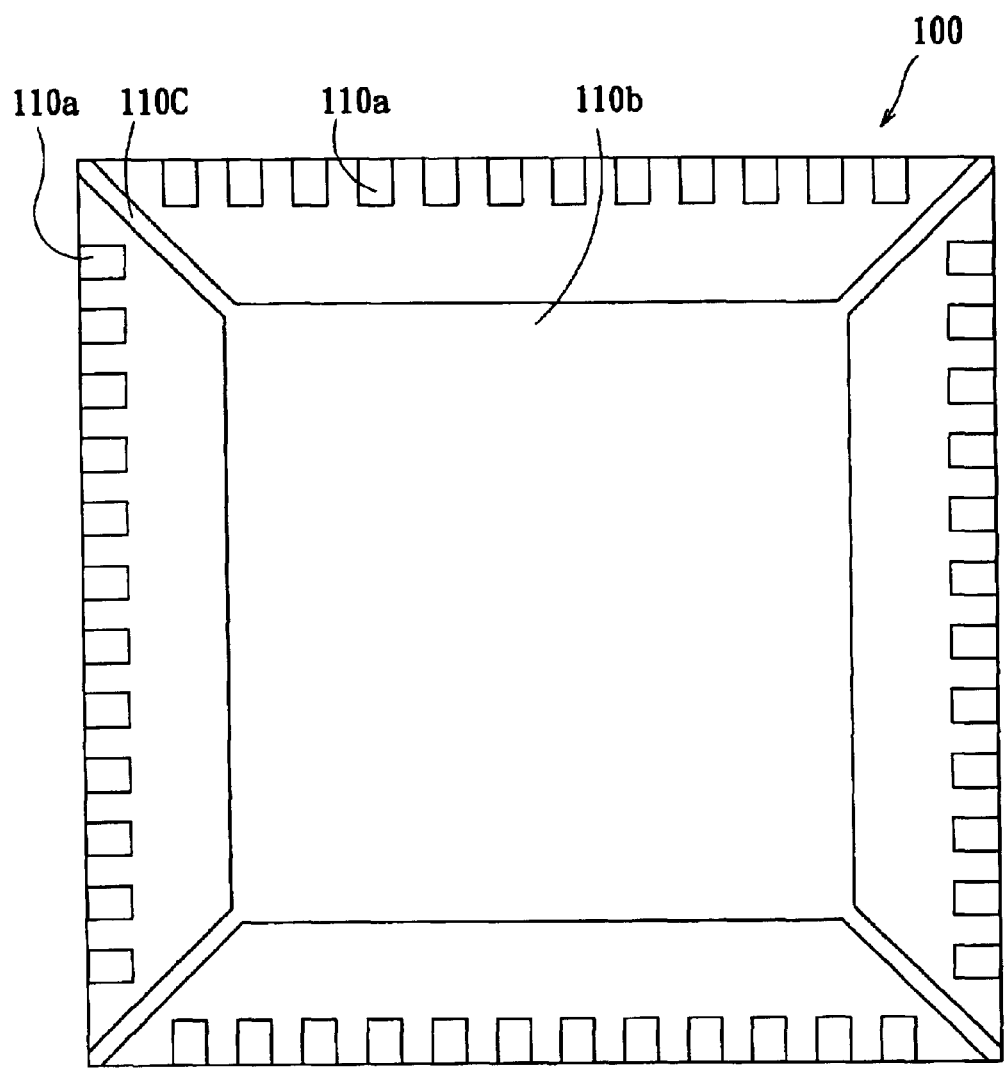
FIG. 1 is a bottom view of the conventional leadless assembly package.
Figure 2:
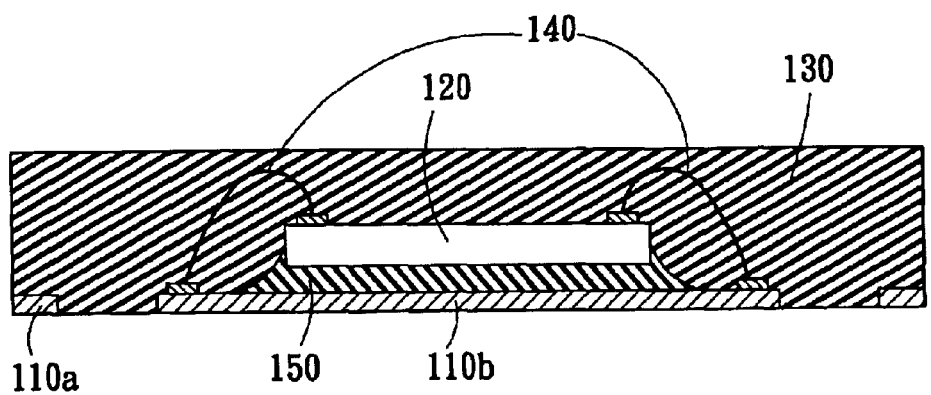
FIG. 2 is a cross-sectional view of the conventional leadless assembly package according to FIG. 1.
Figure 3:
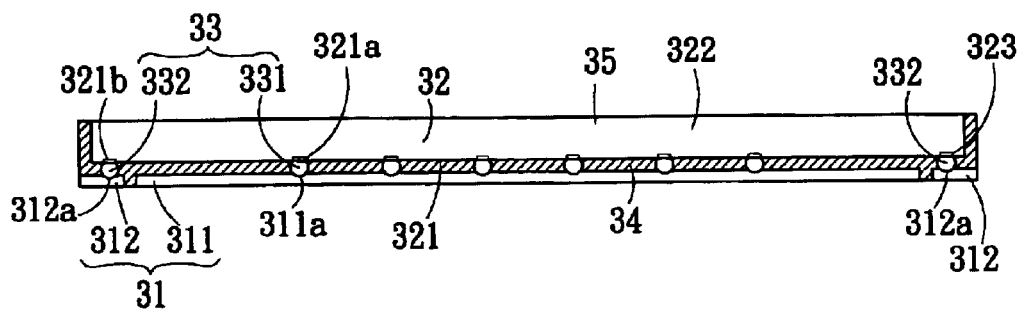
FIG. 3 is a cross-sectional view of a flip chip package according to the first embodiment of the present invention.
Figure 4:
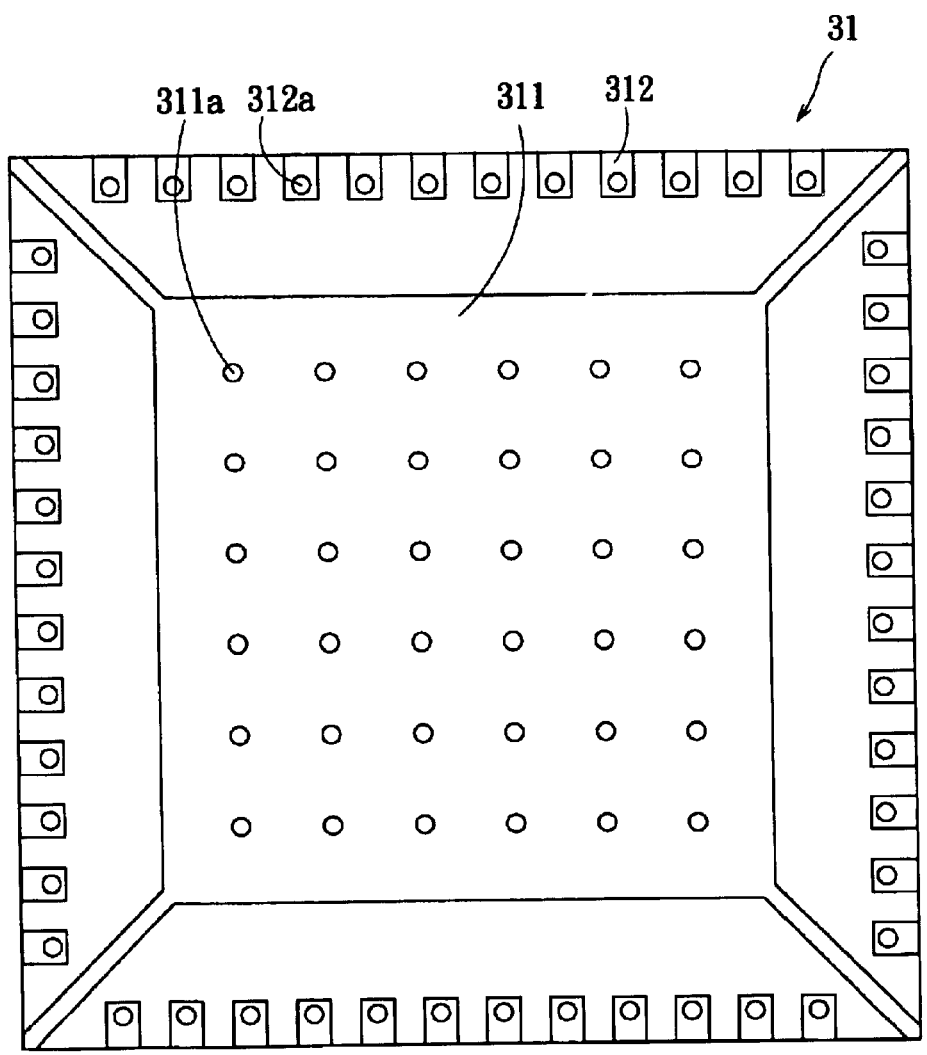
FIG. 4 is a top view of a lead frame according to the first embodiment of FIG. 3.

In accordance with a first preferred embodiment as shown in FIG. 3, there is provided a flip chip package. The flip chip package mainly comprises a lead frame 31, a chip 32 and a plurality of bumps 33. The bumps 33 include first bumps 331 and second bumps 332. The lead frame 31, for example a leadless leadframe, has a die paddle 311 and a plurality of leads 312 surrounding the die paddle 311 as shown in FIG. 4. Therein the die paddle 311 has a plurality of first concavities 311a and one of the leads 312 has a second concavity 312a. The first concavity 311a and the second concavity 312a can be formed by the method of punching and half-etching. Besides, the chip 32 has an active surface 321, a first bonding pads 321a on the active surface 321, a second bonding pads 321b on the active surface, a plurality of first bumps 331 formed on the first bonding pads 321a and a plurality of second bumps 332 formed on the second bonding pads 321b. Moreover, the active surface 321 the chip 32 faces the lead frame 31 and electrically connects to the lead frame 31 via the bumps 32 by the method of flip chip bonding technique.

As mentioned above, the bumps 32 can be electrically conductive bumps, thermal bumps, gold bumps, solder bumps, solder balls and electrically conductive polymer bump or thermally conductive polymer bump. The gold bumps can be formed by the method of the conventional wire-bonding method, and the solder bumps can be formed on the corresponding under-bump-metallurgy layers disposed on the bonding pads by the method of plating or screen-printing, and then performing a reflow process to shape the solder bumps into spherical solder balls.

According to the above-mentioned, at least one first concavity 311a is formed on the die paddle 311 and electrically connected to the first bump 331. Furthermore, at least one of the leads 312 has a second concavity and electrically connected to the second bumps 332.

Due to the die paddle 311 having a first concavity 311a and the leads 312 having a second concavity 312a, the first bumps 331 and the second bumps 332 can be disposed in the first concavities 311a and the second concavities 312a so that the chip 32 can be attached on the lead frame 31 more securely. In such a manner, the chip 32 can be prevented from being dislocated to cause the chip 32 to be tilted and the bumps 32 can be connected to the leads 312 of the lead frame 31 well.

In addition, the first concavities 311a and the second concavities 312a can be filled with an adhesive, such as adhesive glue, in advance (not shown), so as to have the first bumps 321 and the second bumps 322 attached to the lead frame 31 securely. Usually the operation performance of the chip 32 is affected by the wet environment, so the encapsulation, molding compound or similar filler filled in the gap between the chip 32 and the lead frame 31 can prevent the damp air entering into the flip chip package. Moreover, the encapsulation can also cover the chip 32 and exposes the back surface 322 of the chip 32 to the top of the assembly package.

Besides, the first bumps 331 can be conductive bumps, e.g. gold bumps and solder bumps. Thus the die paddle 311 can be electrically connected to the chip 32 via the first bumps 331 to provide the chip 31 another grounding and thermal dissipation paths to enhance the operation performance of the chip 32.

Figure 5:
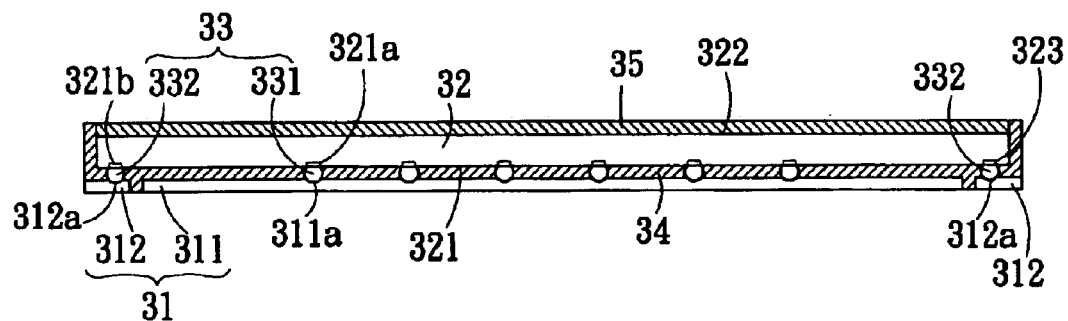
FIG. 5 is a cross-sectional view of a flip chip package according to the second embodiment of the present invention.
Figure 6:
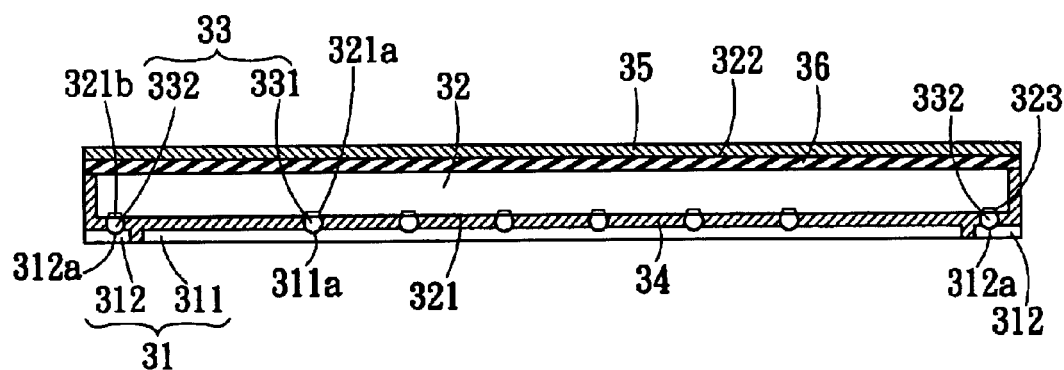
FIG. 6 is a cross-sectional view of a flip chip package according to the third embodiment of the present invention.

In addition, as shown in FIG. 5, a second embodiment similar to the first embodiment is disclosed therein. In order to enhance the thermal performance of the flip chip package, a heat spreader 35 can be disposed on the back surface 322 of the chip 32 and exposed to the top of the flip chip package after encapsulating the chip 32 and the heat spreader 35. In such a way, the heat arisen out of the chip 32 can be directly transmitted to the outside through the heat spreader 35. Next, referring to FIG. 6, a third embodiment is disclosed. As specified in the above, a heat transmission layer 36 or conductive layer 36 can be formed on the back surface 322 of the chip 32 and the surface of the cured encapsulation 34 simultaneously so as to enhance the thermal performance of the assembly package. It should be noted that the reference numeral of each element in FIGS. 5 and 6 corresponds to the same reference numeral of each element in FIG. 4.

Figure 7:
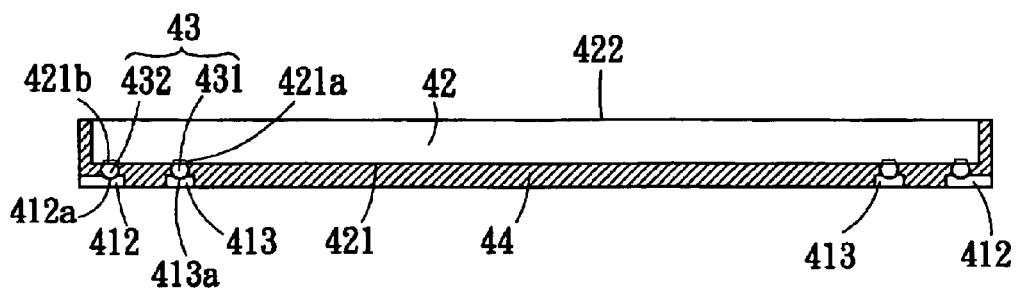
FIG. 7 is a cross-sectional view of a flip chip package according to the fourth embodiment of the present invention.

Next, referring to FIG. 7, a fourth embodiment of a flip chip assembly package is disclosed. The flip chip assembly package mainly comprises a lead frame 41, a chip 42, and a plurality of bumps 43. The bumps 43 include first bumps 431 and second bumps 432. The lead frame 41 has a die paddle 411, a plurality of leads 412 and a plurality of tie bars 413. Therein the tie bars 413 has first concavities 413a and the leads 412 has second concavities 412a. In addition, the chip 42 has an active surface 421, a plurality of first bonding pads 421a and a second bonding pads 421b formed on the active surface 421; and the first bumps 431 and the second bumps 432 are formed on the corresponding first bonding pads 421a and the second bonding pads 421b respectively, and electrically connects the chip 42 and the lead frame 41.

As mentioned above, when the chip 42 is attached to the lead frame 41 in a flip chip fashion, at least one of the first concavities 413a formed on one of the tie bars 413 is electrically connected to one of the first bumps 431. Furthermore, at least one of the second concavities 412a formed on one of the leads 412 is electrically connected to one of the second bumps 432. Because the first bumps 431 and the second bumps 432 can be attached to and disposed in the first concavities 413a and the second concavities 412a, the chip 42 can be prevented from being dislocated and tilted. Thus the electrical performance can be enhanced and mechanical strength of the bumps 43 connecting the lead frame 41 and the chip 42 can be increased.

Moreover, the first concavities 413a and the second concavities 412a can be filled with adhesive glue and then the first bumps 431 and the second bumps 432 can be securely attached to the lead frame 41. Therein, similar to what are provided in the above, the adhesive glue can be electrically conductive adhesive or thermally conductive adhesive. Because the operation performance of the chip 42 is affected by the wet environment so the encapsulation, molding compound, ACF or similar filler filled in the gap between the chip 42 and the lead frame 41 can prevent the damp air entering into the assembly package.

Besides, the first bumps 431 can be conductive bumps, e.g. gold bumps and solder bumps. In such a manner, the first bumps 431 can be electrically connected to the tie bars 413 to provide another grounding and thermal paths to enhance electrical and thermal performance of the flip chip package.

Figure 8:
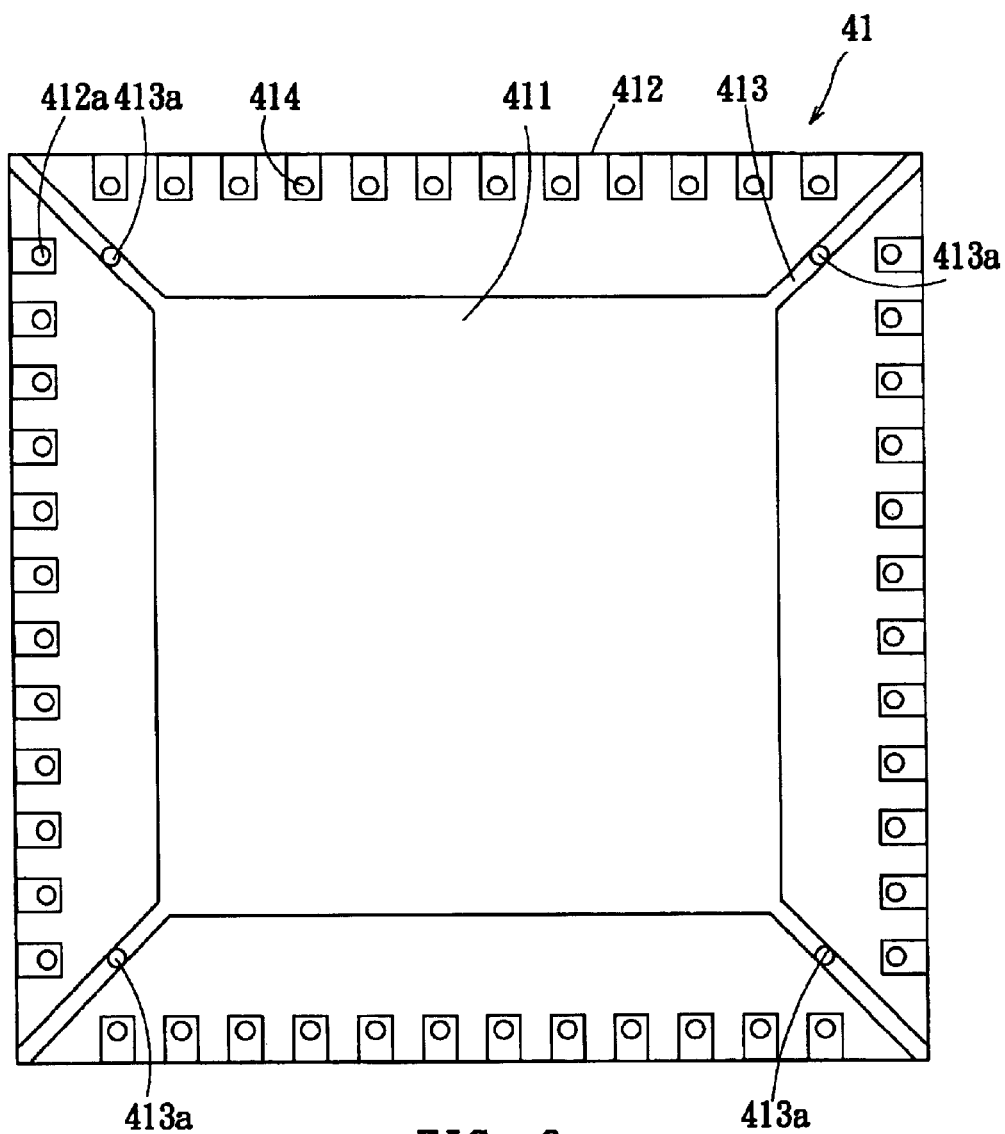
FIG. 8 is a top view of a lead frame according to the fourth embodiment of FIG. 7.
Figure 9:
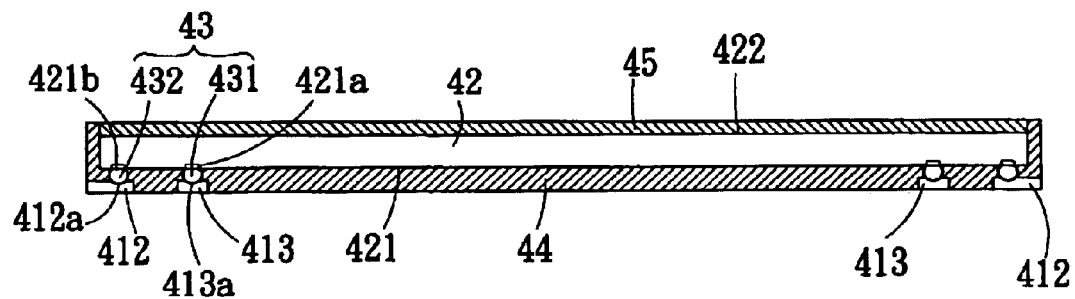
FIG. 9 is a cross-sectional view of a flip chip package according to the fifth embodiment of the present invention.
Figure 10:
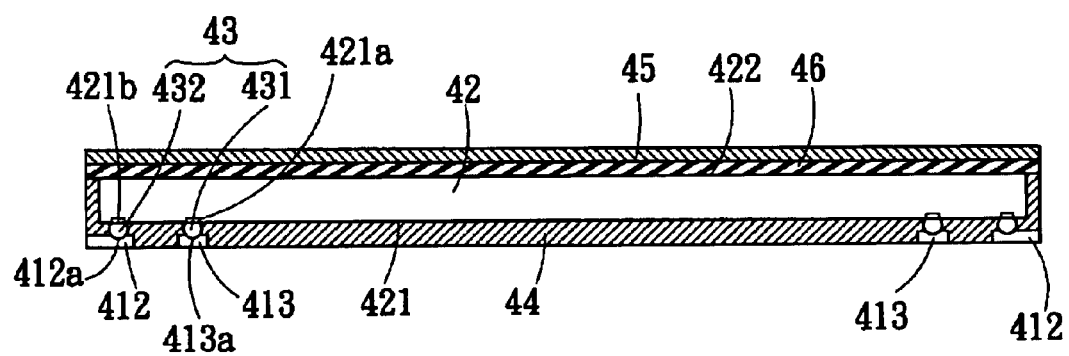
FIG. 10 is a cross-sectional view of a flip chip package according to the sixth embodiment of the present invention.

Next, referring to FIG. 9, a fifth embodiment similar to the fourth embodiment is disclosed. A heat spreader 45 is attached on the back surface 422 of the chip 42, and the encapsulation 44 covers the chip 42 to expose the heat spreader 45 to the outside. Thus the heat arisen from the chip 42 can be transmitted directly to the outside through the exposed heat spreader 45. Finally, referring to FIG. 10, a sixth embodiment is provided. As mentioned above, a heat transmission layer 46 is formed on the back surface 422 of the chip 42 and the surface of the cured encapsulation 44 simultaneously so as to enhance the thermal performance and capability. It also should be noted that the reference numeral of each element in FIGS. 8 and 9 corresponds to the same reference numeral of each element in FIG. 7.

Although the invention has been described in considerable detail with reference to certain preferred embodiments, it will be appreciated and understood that various changes and modifications may be made without departing from the spirit and scope of the invention as defined in the appended claims.

What is claimed is:

1. A flip chip package comprising:
    a lead frame having a die paddle and a plurality of leads surrounding the die paddle;
    a chip having an active surface and a back surface opposed to the active surface, wherein the active surface has a first bonding pad and a second bonding pad; and
    a plurality of first bumps and second bumps formed on the first bonding pads and the second bonding pads respectively, the active surface of the chip facing the lead frame and electrically connecting the die paddle and the leads by the first bumps and the second bumps respectively, wherein the lead frame further comprises a concavity, which connects one of the first bumps and the second bumps.

2. The flip chip package of claim 1, wherein one of the first bumps connects the first concavity and one of the first bonding pads.

3. The flip chip package of claim 2, further comprising a first adhesive filled in the first concavity and connecting the first concavity and one of the first bumps.

4. The flip chip package of claim 1, further comprising a second adhesive filled in the second concavity and connecting the second concavity and one of the second bumps.

5. The flip chip package of claim 1, wherein the first bumps are electrically conductive bumps.

6. The flip chip package of claim 1, wherein the second bumps are electrically conductive bumps.

7. The flip chip package of claim 1, wherein the first bumps are thermally conductive bumps.

8. The flip chip package of claim 1, wherein the first bumps are solder bumps.

9. The flip chip package of claim 1, wherein the second bumps are solder bumps.

10. The flip chip package of claim 1, further comprising an underfill filled in a gap between the active surface of the chip and the lead frame.

11. The flip chip package of claim 1, further comprising a heat spreader mounted on the back surface of the chip.

12. The flip chip package of claim 1, further comprising a heat transmission layer disposed on the back surface of the chip.

13. A flip chip package, comprising:
    a lead frame having a die paddle, a plurality of leads surrounding the die paddle and a tie bar connected the die paddle;
    a chip having an active surface and a back surface opposed to the active surface, wherein the active surface has a first bonding pad and a second bonding pad; and
    a plurality of first bumps and second bumps formed on the first bonding pads and the second bonding pads respectively, wherein the active surface of the chip faces the lead frame and electrically connects the tie bar and the leads by the first bumps and the second bumps respectively,
    wherein the lead frame further comprises a concavity, which connects one of the first bumps and the second bumps.

14. The flip chip package of claim 13, wherein the tie bar further comprises a first concavity formed thereon.

15. The flip chip package of claim 13, further comprising a first adhesive filled in the first concavity and connecting the first concavity and one of the first bumps.

16. The flip chip package of claim 13, wherein one of the leads has a second concavity connecting one of the second bumps.

17. The flip chip package of claim 16, further comprising a second adhesive filled in the second concavity and connecting the second concavity and one of the second bumps.

18. The flip chip package of claim 13, wherein the first bumps are electrically conductive bumps.

19. The flip chip package of claim 18, wherein the first bumps are solder bumps.

20. The flip chip package of claim 13, wherein the second bumps are electrically conductive bumps.

21. The flip chip package of claim 20, wherein the second bumps are solder bumps.

22. The flip chip package of claim 13, wherein the first bumps are thermally conductive bumps.

23. The flip chip package of claim 13, further comprising an underfill filled in a gap between the active surface of the chip and the lead frame.

24. The flip chip package of claim 13, further comprising a heat spreader mounted on the back surface of the chip.

25. The flip chip package of claim 13, further comprising a heat transmission layer disposed on the back surface of the chip.

26. A flip chip package, comprising:
    a lead frame having a die paddle and a plurality of leads surrounding the die paddle;
    a chip having an active surface and a back surface opposed to the active surface, wherein the active surface has a first bonding pad and a second bonding pad; and
    a plurality of first bumps and second bumps formed on the first bonding pads and the second bonding pads respectively, the active surface of the chip facing the lead frame and electrically connecting the die paddle and the leads by the first bumps and the second bumps respectively,
    wherein the lead frame further comprises a concavity, which connects one of the first bumps and the second bumps.

27. The flip chip package of claim 26, wherein one of the first bumps connects the first concavity and one of the first bonding pads.

28. The flip chip package of claim 27, further comprising a first adhesive filled in the first concavity and connecting the first concavity and one of the first bumps.

29. The flip chip package of claim 26, further comprising a second adhesive filled in the second concavity and connecting the second concavity and one of the second bumps.

30. The flip chip package of claim 26, wherein the firs-bumps are electrically conductive bumps.

31. The flip chip package of claim 26, wherein the second bumps are electrically conductive bumps.

32. The flip chip package of claim 26, wherein the first bumps are thermally conductive bumps.

33. The flip chip package of claim 26, wherein the first bumps are solder bumps.

34. The flip chip package of claim 26, wherein the second bumps are solder bumps.

35. The flip chip package of claim 26, further comprising an underfill filled in a gap between the active surface of the chip and the lead frame.

36. The flip chip package of claim 26, further comprising a heat spreader mounted on the back surface of the chip.

37. The flip chip package of claim 26, further comprising a heat transmission layer disposed on the back surface of the chip.

38. A flip chip package, comprising:
- a lead frame having a die paddle, a plurality of leads surrounding the die paddle and a tie bar connected the die paddle;
- a chip having an active surface and a back surface opposed to the active surface, wherein the active surface has a first bonding pad and a second bonding pad; and
- a plurality of first bumps and second bumps formed on the first bonding pads and the second bonding pads respectively, wherein the active surface of the chip faces the lead frame and electrically connects the tie bar and the leads by the first bumps and the second bumps respectively,
- wherein one of the leads has a second concavity, which connects one of the second bumps.

39. The flip chip package of claim 38, further comprising a second adhesive filled in the second concavity and connecting the second concavity and one of the second bumps.

40. The flip chip package of claim 38, wherein the tie bar further comprises a first concavity formed thereon.

41. The flip chip assembly package of claim 40, wherein one of the first bumps connects the first concavity and one of the first bonding pads.

42. The flip chip package of claim 41, further comprising a first adhesive filled in the first concavity and connecting the first concavity and one of the first bumps.

43. The flip chip package of claim 38, wherein the first bumps are electrically conductive bumps.

44. The flip chip package of claim 43, wherein the first bumps are solder bumps.

45. The flip chip package of claim 38, wherein the second bumps are electrically conductive bumps.

46. The flip chip package of claim 45, wherein the second bumps are solder bumps.

47. The flip chip package of claim 38, wherein the first bumps are thermally conductive bumps.

48. The flip chip package of claim 38, further comprising an underfill filled in a gap between the active surface of the chip and the lead frame.

49. The flip chip package of claim 38, further comprising a heat spreader mounted on the back surface of the chip.

50. The flip chip package of claim 38, further comprising a heat transmission layer disposed on the back surface of the chip.

* * * * *